United States Patent
Chen et al.

(10) Patent No.: US 9,620,369 B2
(45) Date of Patent: Apr. 11, 2017

(54) METHOD FOR FABRICATING SEMICONDUCTOR DEVICE TO INTEGRATE TRANSISTOR WITH PASSIVE DEVICE

(71) Applicant: UNITED MICROELECTRONICS CORPORATION, Hsinchu (TW)

(72) Inventors: Chieh-Te Chen, Kaohsiung (TW); Shih-Fang Tzou, Hsinchu (TW); Jiunn-Hsiung Liao, Tainan (TW); Yi-Po Lin, Tainan (TW)

(73) Assignee: UNITED MICROELECTRONICS CORPORATION

( * ) Notice: Subject to any disclaimer, the term of this patent is extended or adjusted under 35 U.S.C. 154(b) by 157 days.

(21) Appl. No.: 14/103,827

(22) Filed: Dec. 11, 2013

(65) Prior Publication Data

US 2014/0099760 A1    Apr. 10, 2014

Related U.S. Application Data

(62) Division of application No. 13/267,068, filed on Oct. 6, 2011, now Pat. No. 8,633,549.

(51) Int. Cl.
| | |
|---|---|
| *H01L 21/027* | (2006.01) |
| *H01L 21/8232* | (2006.01) |
| *H01L 21/28* | (2006.01) |
| *H01L 27/06* | (2006.01) |
| *H01L 21/321* | (2006.01) |
| *H01L 21/3213* | (2006.01) |

(52) U.S. Cl.
CPC ...... *H01L 21/28079* (2013.01); *H01L 21/027* (2013.01); *H01L 21/3212* (2013.01); *H01L 21/32139* (2013.01); *H01L 21/8232* (2013.01); *H01L 27/0629* (2013.01)

(58) Field of Classification Search
CPC ............. H01L 27/0629; H01L 21/027; H01L 21/8232; H01L 21/3212; H01L 21/32139; H01L 21/28079
USPC .......... 257/379, E27.071, E21.616; 438/238
See application file for complete search history.

(56) References Cited

U.S. PATENT DOCUMENTS

| | | | |
|---|---|---|---|
| 6,043,138 A | 3/2000 | Ibok | |
| 6,372,605 B1 | 4/2002 | Kuehne | |
| 6,509,232 B1 | 1/2003 | Kim | |
| 6,670,275 B2 | 12/2003 | Lee | |
| 7,030,430 B2 | 4/2006 | Doczy | |
| 7,084,025 B2 | 8/2006 | Phua | |

(Continued)

*Primary Examiner* — Long K Tran
*Assistant Examiner* — Thai T Vuong
(74) *Attorney, Agent, or Firm* — Ding Yu Tan (57) ABSTRACT

A method for fabricating a semiconductor device, wherein the method comprises steps as follows: A dummy gate with a poly-silicon gate electrode and a passive device having a poly-silicon element layer are firstly provided. A hard mask layer is then formed on the dummy gate and the passive device. Next, a first etching process is performed to remove a portion of the hard mask layer to expose a portion of the poly-silicon element layer. Subsequently, an inner layer dielectric (ILD) is formed on the dummy gate and the poly-silicon element layer, and the ILD is flattened by using the hard mask layer as a polishing stop layer. Thereafter, a second etching process is performed to remove the poly-silicon gate electrode, and a metal gate electrode is formed on the location where the poly-silicon gate electrode was initially disposed.

9 Claims, 6 Drawing Sheets

(56) References Cited

U.S. PATENT DOCUMENTS

| | | |
|---|---|---|
| 7,153,755 B2 | 12/2006 | Liu |
| 7,208,366 B2 | 4/2007 | Tsai |
| 7,384,880 B2 | 6/2008 | Brask |
| 7,521,324 B2 | 4/2009 | Ohmi |
| 7,592,270 B2 | 9/2009 | Teo |
| 7,601,648 B2 | 10/2009 | Chua |
| 7,824,990 B2 | 11/2010 | Chang |
| 2005/0202624 A1 | 9/2005 | Li |
| 2009/0200494 A1 | 8/2009 | Hatem |
| 2009/0289284 A1 | 11/2009 | Goh |
| 2010/0052058 A1* | 3/2010 | Hsu et al. .................. 257/364 |
| 2010/0075507 A1 | 3/2010 | Chang |
| 2010/0184281 A1 | 7/2010 | Hsu |
| 2010/0237435 A1 | 9/2010 | Chudzik et al. |
| 2010/0328022 A1 | 12/2010 | Fan |
| 2011/0117710 A1* | 5/2011 | Lin et al. .................... 438/238 |
| 2011/0156162 A1* | 6/2011 | Richter ............ H01L 27/0629 257/379 |

* cited by examiner

METHOD FOR FABRICATING SEMICONDUCTOR DEVICE TO INTEGRATE TRANSISTOR WITH PASSIVE DEVICE

CROSS-REFERENCE TO RELATED APPLICATION

This application is a divisional application of U.S. application Ser. No. 13/267,068, filed on Oct. 6, 2011, and now pending. The entirety of the above-mentioned patent application is hereby incorporated by reference herein and made a part of this specification.

FIELD OF THE INVENTION

The present invention relates to a fabrication method of a semiconductor device, more particularly to a fabrication method of a field effect transistor (FET) with a metal gate.

BACKGROUND OF THE INVENTION

With the development of the electrical technology, a FET with high integrity and operation speed is required. As each technology nodes shrink, the dimensions of a FET and the thickness of its gate oxide, however, must be reduced and gate leakage could be more likely triggered by the reduced gate length.

In order to reduce gate leakage, high dielectric constant (high-k) gate insulator layers are used and the conventional polysilicon gate electrode is replaced with a metal gate (MG) electrode to improve the device performance as the feature sizes has being decreased.

The conventional technique for fabricating a metal gate transistor includes the following steps: Firstly a metal-oxide-semiconductor (MOS) transistor with a poly-silicon dummy gate electrode is formed. After the MOS transistor is completed, the dummy gate electrode will be removed by an etching process. Subsequently, a metal layer is deposited in the region where the dummy gate electrode was originally located, while a MG electrode of the metal gate transistor is formed.

However, removing the dummy gate and depositing the metal layer may conversely affect the integration of the metal gate transistor with other semiconductor devices. For example, a poly-silicon layer initially used to form the dummy gate electrode of the MOS transistor may be used to form an element layer of a passive device, such as an electric resistor. To avoid the poly-silicon element layer from damages resulted by the etching process, a photo-resist may be required to mask the poly-silicon element layer of the electrical resistor before the etching process for removing the dummy gate electrode is carried out, thereby a step height measured from the MG electrode of the metal gate transistor and the element layer of the electrical resistor may occur. Thus certain amount of metal resides may be remained on the peripheral area of the electrical resistor after the metal deposition and a subsequent metal contact formation is performed. Accordingly, device performance may deteriorate.

Therefore, it is necessary to provide an advanced semiconductor device and the fabrication method thereof to obviate the drawbacks and problems encountered from the prior art.

SUMMARY OF THE INVENTION

An aspect of the present invention is to provide a method for fabricating a semiconductor device, wherein the method comprises steps as follows: A dummy gate with a poly-silicon gate electrode and a passive device having a poly-silicon element layer are firstly provided. A hard mask layer is then formed on the dummy gate and the passive device. Next, a first etching process is performed to remove a portion of the hard mask layer to expose a portion of the poly-silicon element layer. Subsequently, an inner layer dielectric (ILD) is formed on the dummy gate and the poly-silicon element layer, and the ILD is flattened by using the hard mask layer as a polishing stop layer. Thereafter, a second etching process is performed to remove the poly-silicon gate electrode, and a metal gate electrode is formed on the location where the poly-silicon gate electrode was initially disposed.

In one embodiment of the present invention, the first etching process further removes a portion of the poly-silicon element layer, whereby a recess is formed in the passive device to expose the remaining poly-silicon element layer.

In some embodiment of the present invention, the formation of the dummy gate and the passive device comprises following steps: A dielectric material layer and a poly-silicon layer are provided in sequence on a substrate. The dielectric material layer and a poly-silicon layer are then patterned to form the poly-silicon gate electrode and the poly-silicon element layer on the patterned dielectric material layer. Subsequently, a first spacer and a second spacer are respectively formed on the poly-silicon gate electrode and the poly-silicon element layer.

In one embodiment of the present invention, the dielectric material layer comprises an IL and a high-k dielectric layer stacked in sequence at the substrate. In one embodiment of the present invention, the method further comprises steps of forming a capping layer disposed between the metal gate electrode and high-k dielectric layer. In one embodiment of the present invention, the method further comprises forming a working function layer on the capping layer, prior to the formation of the metal gate electrode.

In one embodiment of the present invention, the method further comprises forming a source/drain structure by using the dummy gate as a mask, before the second etching process is carried out. In one embodiment of the present invention, prior to the formation of the metal gate electrode, the method further comprises forming a high-k dielectric layer on the location where the poly-silicon gate electrode was initially disposed, and forming at least one working function layer on the high-k dielectric layer.

In one embodiment of the present invention, the second etching process comprises a wet etching and a dry etching. In one embodiment of the present invention, the steps of flattening the ILD comprise a chemical mechanism polishing (CMP) process.

In accordance with the aforementioned embodiments of the present invention, a semiconductor device in which a metal gate transistor and a passive device are integrated is fabricated by a process for fabricating the semiconductor device which comprises steps as follows: A hard mask layer is firstly formed to cover a dummy gate electrode and a passive device. A first etching process is subsequently performed to remove a portion of the hard mask layer, so as to expose a portion of a poly-silicon element layer of the passive device. Subsequently, a second etching process is performed to remove the dummy gate electrode. After a metal deposition and a metal planarization process are carried out, a metal gate coplanar with the passive device is provided.

By performing these two separate etching processes respectively for thinning the poly-silicon element layer and removing the poly-silicon gate electrode, the passive device and the metal gate can get a coplanar surface on which metal contacts can be formed without remaining undesired metal residues. Therefore the performance of the semiconductor device can be improved significantly.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention is to provide an advanced semiconductor device and the fabricating method thereof used to integrate a metal gate transistor with a passive device. The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
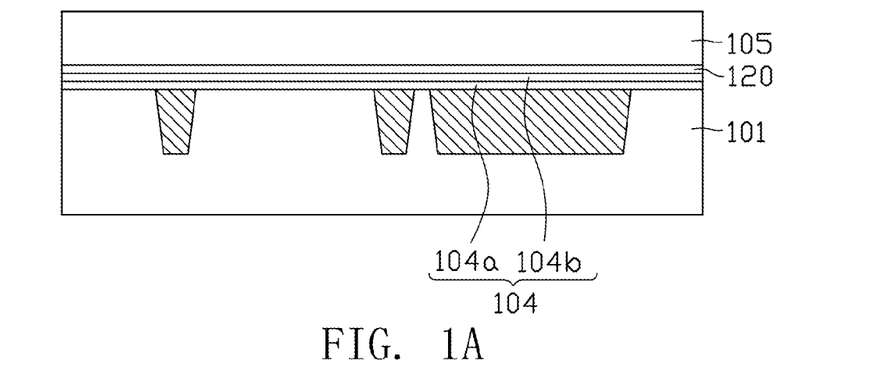
FIGS. 1A to 1G are cross-sectional views illustrating the method for fabricating a semiconductor device in accordance with one embodiment of the present invention.
Figure 1B:
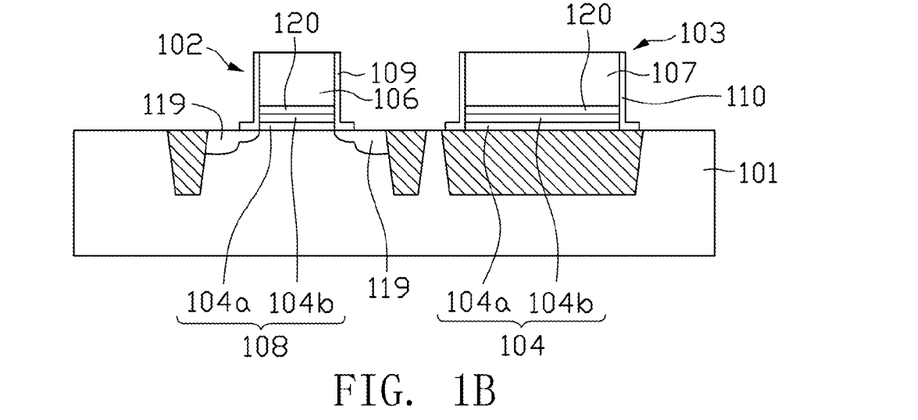

FIGS. 1A to 1G are cross-sectional views illustrating the method for fabricating a semiconductor device 100 in accordance with one embodiment of the present invention, wherein the method comprises steps as follows:

A substrate 101 having a dielectric material layer 104, a capping layer 120 and a poly-silicon layer 105 sequentially stacked on the substrate 101 is provided (see FIG. 1A). In the present embodiment, the dielectric material layer 104 comprises an IL 104a and high-k dielectric layer 104b sequentially stacked on the substrate 101. The IL 104a is preferably made of silicon oxide ($SiO_2$), silicon nitride (SiN), silicon oxynitride (SiON) or silicon carbonitride (SiCN). The high-k dielectric layer 104b is preferably made of hafnium silicon, hafnium oxide, hafnium silicon oxide or hafnium silicon oxynitride. The capping layer 120 is preferably made of titanium nitride (TiN) or tantalum nitride (TaN). In some embodiments of the present invention, at least one hard mask layer (not shown) may be provided on the poly-silicon layer 105.

Next, the dielectric material layer 104 and the poly-silicon layer 105 are patterned, whereby a poly-silicon gate electrode 106 and a poly-silicon element layer 107 are respectively formed on the patterned dielectric material layer 104 (thereinafter the portion of the patterned dielectric material layer 104 beneath the poly-silicon gate electrode 106 is referred as gate dielectric layer 108). Oxide deposition and oxide etching processes are then performed to form a first spacer 109 disposed on the sidewalls of the poly-silicon gate electrode 106 and a second spacer 110 disposed on the sidewalls of the poly-silicon element layer 107, meanwhile a dummy gate 102 and a passive device 103 are formed on the substrate 101. In the present embodiment, the passive device 103 is an electrical resistor.

Prior to the formation of the first spacer 109 and the second spacer 110, a plurality of light doped drain (LDD) implantation process steps by using the poly-silicon gate electrode 106 and the gate dielectric layer 108 as a mask are performed to make a LDD structure in the substrate 101 and adjacent to the gate dielectric layer 108. After the first spacer 109 and the second spacer 110 are formed, a series of ion implantation processes are then carried out on the LDD structure by using the dummy gate 102 as a mask, whereby a source/drain structure 119 is formed in the substrate 101 (see FIG. 1B.)

Figure 1C:
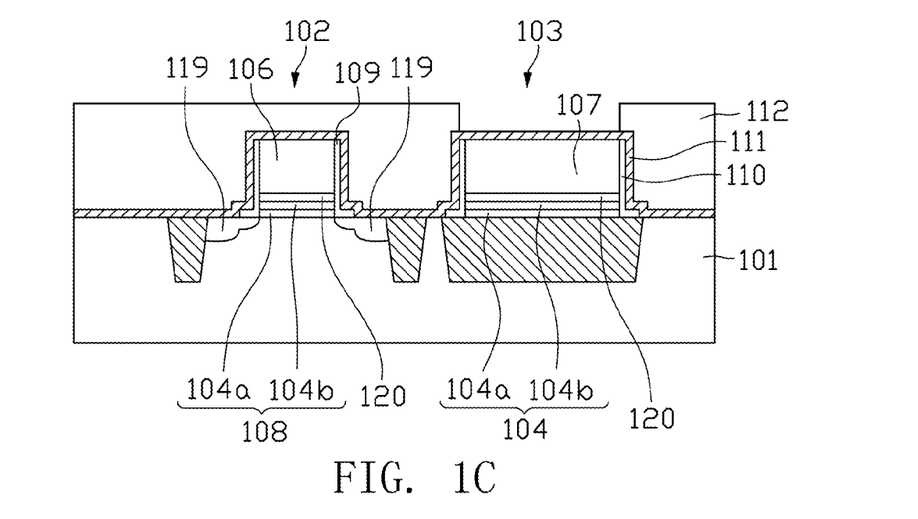

Subsequently, a hard mask layer 111 is formed on the dummy gate 102 and the passive device 103, and a patterned photo-resist 112 is then formed on the hard mask layer 111 to expose a portion of the hard mask layer 111 which is disposed over the poly-silicon element layer 107 (see FIG. 1C).

A first etching process is performed to remove a portion of the hard mask layer 111, so as to define an opening 111a on the hard mask layer 111 and expose the poly-silicon element layer 107. The hard mask layer 111 can be a contact etching stop layer (CESL) made of SiN, SiC or SiCN, and preferably is a SiN multilayer.

Figure 1D:
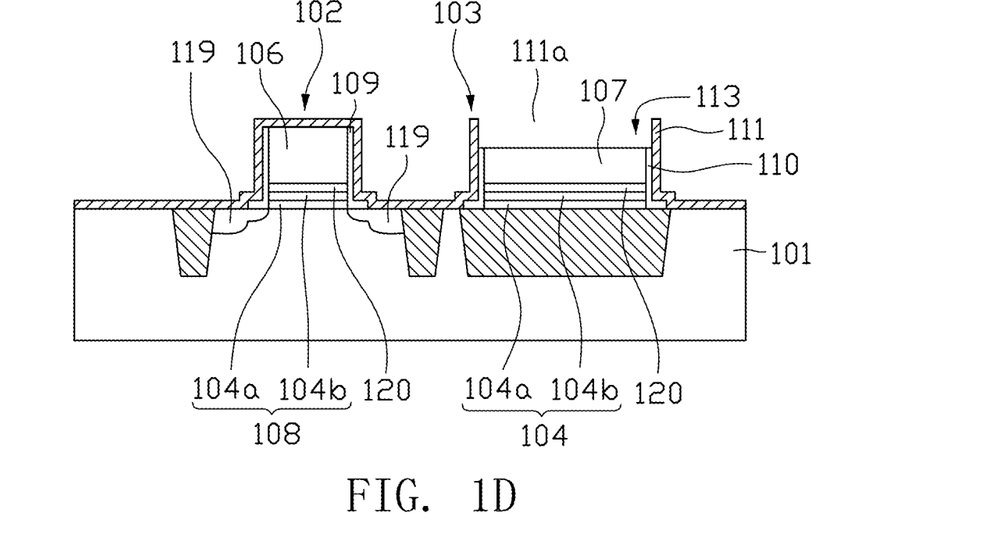
Figure 1E:
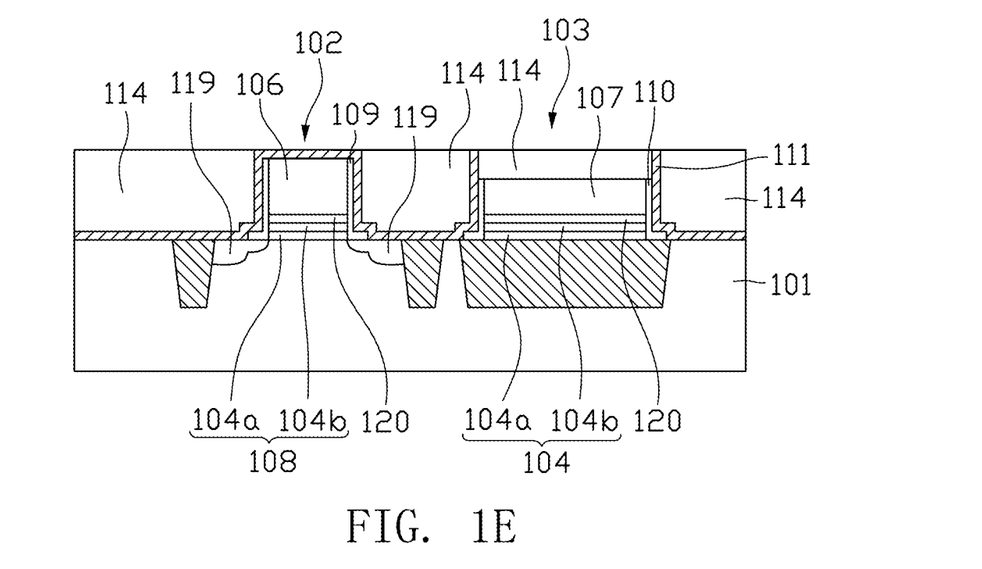

In some preferred embodiments, the first etching process may further remove a portion of the poly-silicon element layer 107 to formed a recess 113, and the remaining portion of the poly-silicon element layer 107 can be exposed from the recess 113 and the opening 111a (see FIG. 1D).

An ILD 114 is formed on the dummy gate 102 and the passive device 103, so as to fill the recess 113. The ILD 114 is then flattened by using the hard mask layer 111 as a polishing stop layer (see FIG. 1E). In the present invention, the steps of flattening the ILD 114 comprise a chemical mechanism polishing (CMP) process.

Figure 1F:
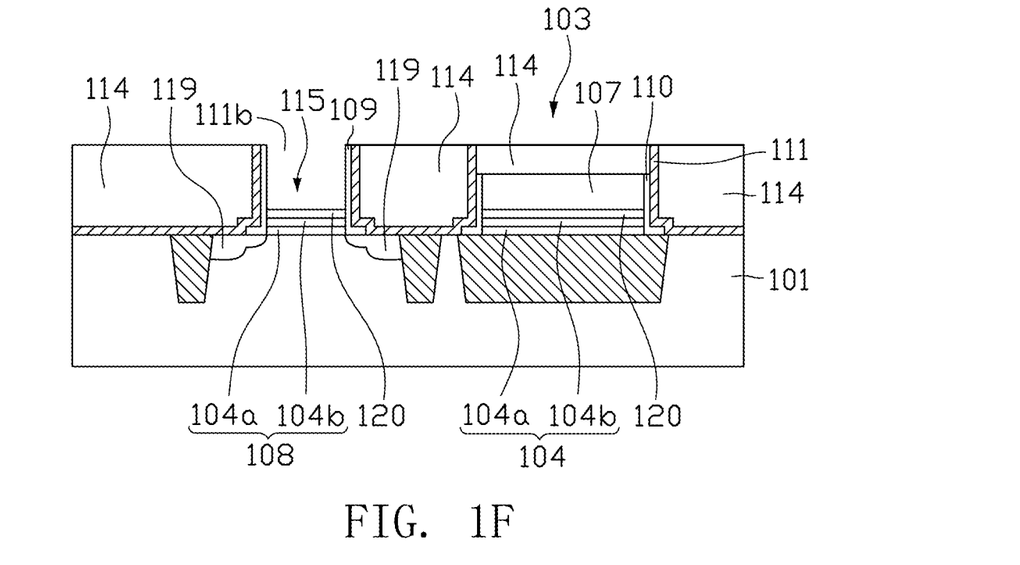
Figure 1G:
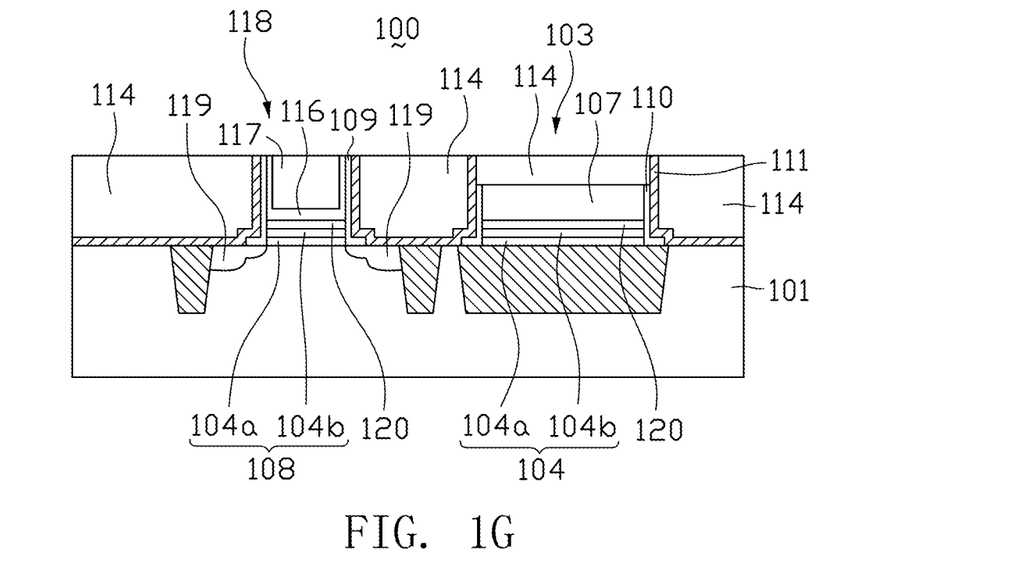

After that, a second etching process is performed on the dummy gate 102 by using the capping layer 120 as an etching stop layer, to remove a portion of the hard mask layer 111 covered on the dummy gate 102 and the poly-silicon gate electrode 106, whereby an opening 111b is define on the hard mask layer 111, a recess 115 is further formed in the dummy gate 102, and the capping layer 120 is exposed via the recess 115 and the opening 111b (see FIG. 1F). In some embodiments, the second etching process may comprise a dry etching process and a wet etching process. In the present embodiment, a dry etching process is firstly applied for removing the hard mask layer 111: and a wet etching process is then applied for removing the poly-silicon gate electrode 106.

At least one working function layer 116, such as a TiN or titanium/aluminum alloy (TaAl) layer, is then formed on the capping layer 104c. A metal layer is subsequently deposited on the capping layer 120, and a metal gate 118 having a metal gate electrode 117 is then formed after the metal layer is flattened, and meanwhile the semiconductor device 100 is formed (see FIG. 1G). A subsequent process for fabricating metal contacts electrically connected to metal lines (not shown) may be performed on the metal gate 118 and the passive device 103.

Figure 2A:
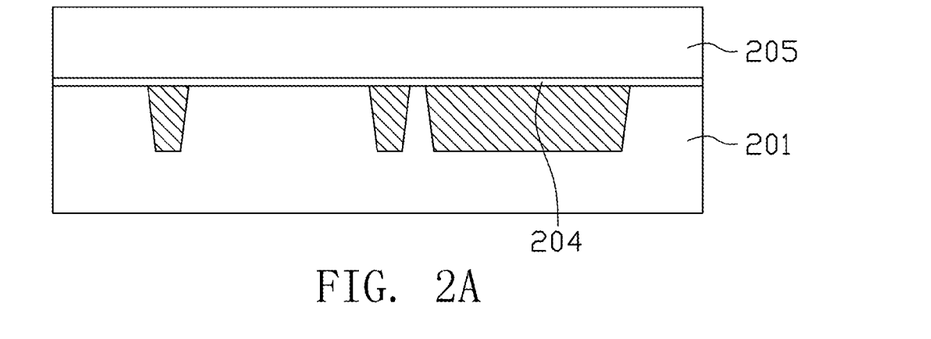
FIGS. 2A to 2G are cross-sectional views illustrating the method for fabricating a semiconductor device in accordance with another embodiment of the present invention.
Figure 2B:
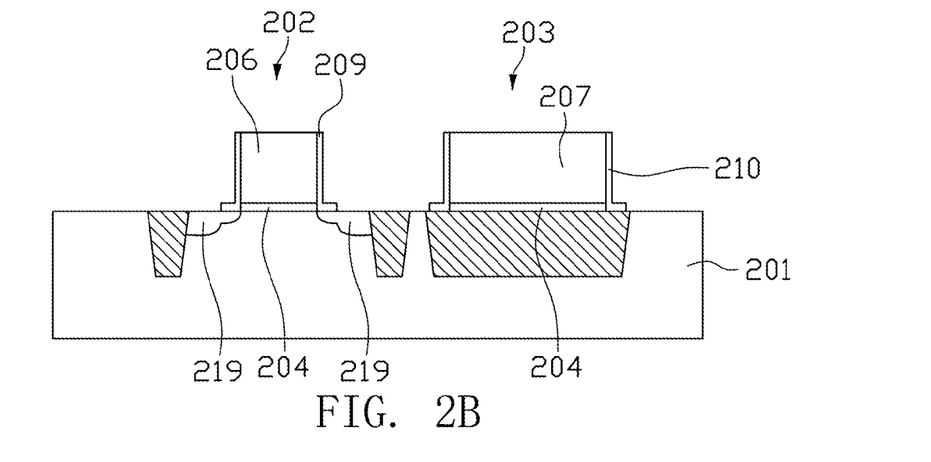

FIGS. 2A to 2G are cross-sectional views illustrating the method for fabricating a semiconductor device 200 in accordance with another embodiment of the present invention, wherein the method comprises steps as follows:

A substrate 201 having a dielectric material layer 204 and a poly-silicon layer 205 sequentially stacked on the substrate 201 is provided (see FIG. 2A). In the present embodiment, the dielectric material layer 204 is preferably made of $SiO_2$, SiN, SiON or SiCN.

Next, the dielectric material layer 204 and the poly-silicon layer 205 are patterned, whereby a poly-silicon gate electrode 206 and a poly-silicon element layer 207 are respectively formed on the patterned dielectric material layer 204. Oxide deposition and oxide etching processes are then performed to form a first spacer 209 disposed on the sidewalls of the poly-silicon gate electrode 206 and a second spacer 210 disposed on the sidewalls of the poly-silicon element layer 207, meanwhile a dummy gate 202 and a passive device 203 (preferably is an electrical resistor) are formed on the substrate 201.

Prior to the formation of the first spacer 209 and the second spacer 210, a plurality of light doped drain (LDD) implantation process steps are performed by using the poly-silicon gate electrode 206 and the gate dielectric layer 208 as a mask to make a LDD structure in the substrate 201 and adjacent to the gate dielectric layer 208. After the first spacer 209 and the second spacer 210 are formed, a series of ion implantation processes are then carried out on the LDD structure by using the dummy gate 202 as a mask, whereby a source/drain structure 219 is formed in the substrate 201 (see FIG. 2B).

Figure 2C:
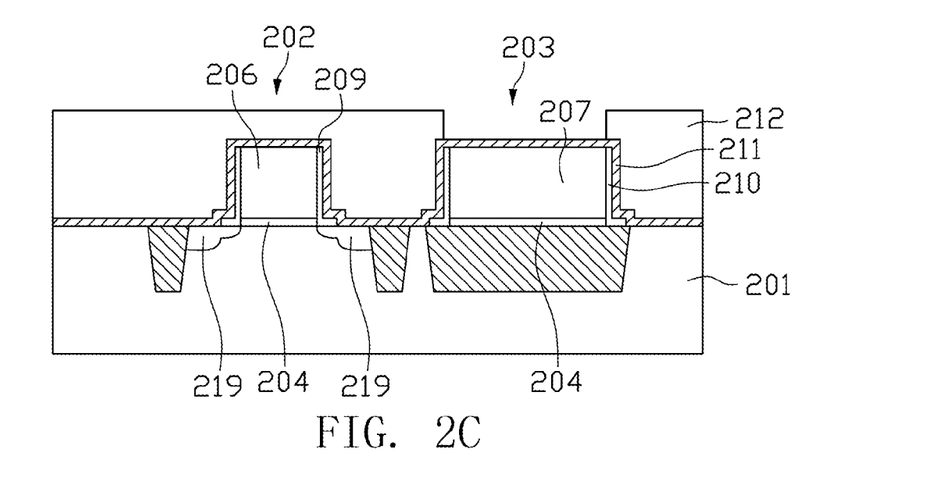

Subsequently, a hard mask layer 211 is formed on the dummy gate 202 and the passive device 203, and a patterned photo-resist 212 is then formed on the hard mask layer 211 to expose a portion of the hard mask layer 211 which is disposed over the poly-silicon element layer 207 (see FIG. 2C). The hard mask layer 211 can be a contact etching stop layer (CESL) made of SiN, SiC or SiCN, and preferably is a SiN multilayer.

Figure 2D:
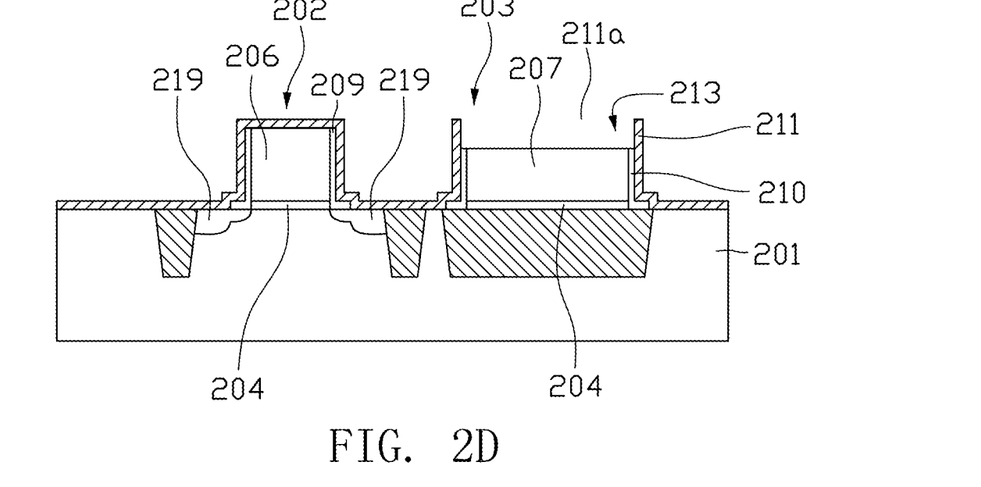
Figure 2E:
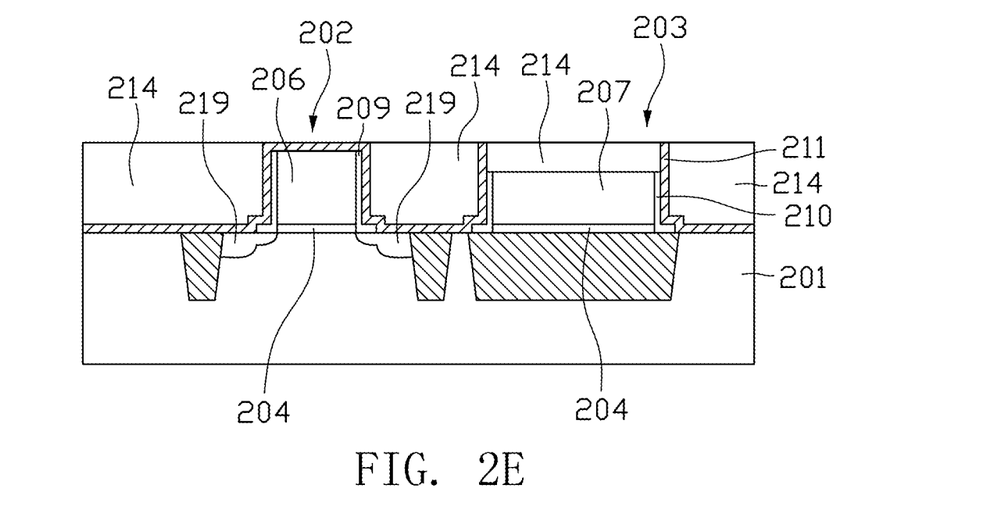

A first etching process is performed to remove a portion of the hard mask layer 211 and a portion of the poly-silicon element layer 207 to define an opening 211a on the hard mask layer 211 and further to form a recess 213 in the passive device 203, whereby the remaining poly-silicon element layer 207 is exposed via the recess 213 and the opening 211a (see FIG. 2D).

An ILD 214 is formed on the dummy gate 202 and the passive device 203, so as to fill the recess 213. The ILD 214 is then flattened by using the hard mask layer 211 as a polishing stop layer (see FIG. 2E). In the present invention, the steps of flattening the ILD 214 comprise a CMP process.

Figure 2F:
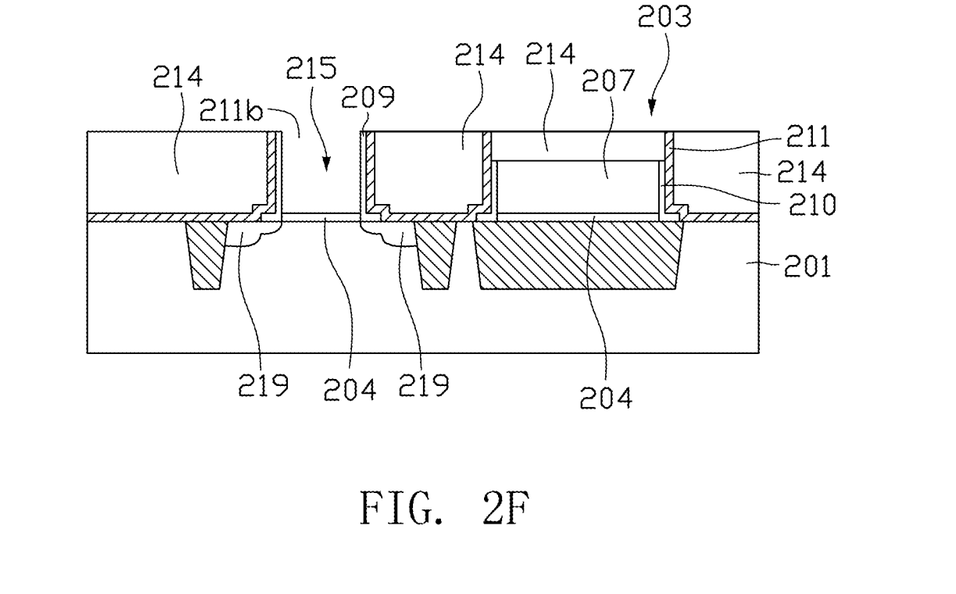

After that a second etching process is performed by using the dielectric material layer 204 as an etching stop layer to remove a portion of the hard mask layer 211 covered on the dummy gate 202 and the poly-silicon gate electrode 206, whereby an opening 211b is define on the hard mask layer 211, a recess 215 is further formed in the dummy gate 202, and the dielectric material layer 204 is exposed via the recess 215 and the opening 211b (see FIG. 2F). In some embodiments, the second etching process may comprise a dry etching process and a wet etching process. In the present embodiment, a dry etching process is firstly applied for removing the hard mask layer 211; and a wet etching process is then applied for removing the poly-silicon gate electrode 206.

After the poly-silicon gate electrode is removed, a gate dielectric layer 208 with high dielectric constant (referred as high-k gate dielectric layer 208) is formed on the dielectric material layer 204 exposed from the recess 215 and the opening 211b. In the present embodiment, the high-k gate dielectric layer 208 comprises an IL 208a and the high-k material layer 208b sequentially stacked on the dielectric material layer 204.

At least one working function layer 216, such as a TiN or titanium/aluminum alloy (TaAl) layer, is then formed on the high-k material layer 208b. A metal layer is subsequently deposited on the high-k material layer 208b, a metal gate 218 having a metal gate electrode 217 is formed after the metal layer is flattened, and meanwhile the semiconductor device 200 is formed (see FIG. 2G). A subsequent process for fabricating metal contacts electrically connected to metal lines (not shown) may be performed on the metal gate 218 and the passive device 203.

Referring to FIG. 2G again, the semiconductor device 200 of the present embodiment comprises the metal gate 218, the hard mask layer 211 and the passive device 203, wherein the hard mask layer 211 is disposed on the sidewalls of the metal gate 218 and the passive device 203 and respectively conformal with the first spacer 209 of the metal gate 218 and the second spacer 210 of the passive device 203.

Figure 2G:
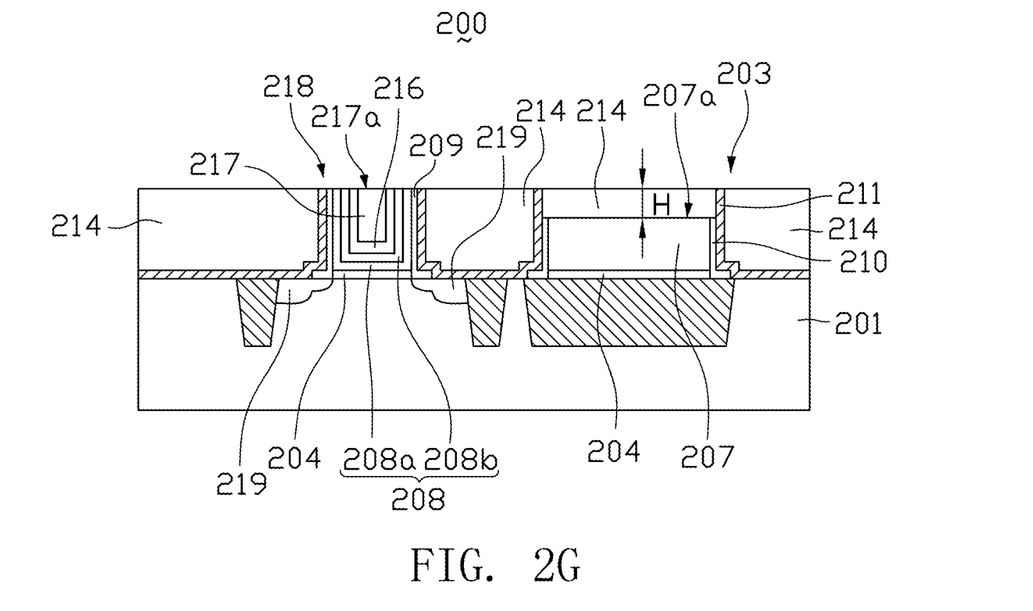

In addition, the hard mask layer 211 has two openings, such as opening 211a and opening 211b, from which the metal gate electrode 217 of the metal gate 218 and the poly-silicon element layer 207 of the passive device 203 can be respectively exposed. These two openings 211a and 211b are substantially coplanar with each other; nevertheless, they are respectively defined by different etching processes. It is because that the hard mask layer 211 is subjected at least one planarization process after the two different etching processes, such that the two openings will be formed on the same plane. In other words, the metal gate 218 and the passive device 203 have a coplanar base for fabricating the metal contacts.

It is worthy to note that, since the poly-silicon element layer 207 of the passive device 203 is partially removed during the first etching process, the thickness of the poly-silicon element layer 207 is less than the total thickness of the metal gate electrode 217, the gate dielectric layer 208 and the working function layer 216 by which the poly-silicon gate electrode 206 is replaced to form the metal gate 218. Thus after the metal gate electrode 217, the gate dielectric layer 208 and the working function layer 216 are planarized, there still exists a step height H between the opening 211b and the poly-silicon element layer 207. In other words, even the openings 211a and 211b used for respectively exposing the metal gate electrode 217 and the poly-silicon element layer 207 are coplanar with the planarized surface, the distance between the opening 215 and the top surface 217a of the metal gate electrode 217 is still less than the distance between the opening 213 and the top surface 207a of the poly-silicon element layer 207. There is a height difference substantially equal to the step height H between the top surface 217a of the metal gate electrode 217 and the top surface 207a of the poly-silicon element layer 207.

In accordance with the aforementioned embodiments of the present invention, a process for fabricating a semiconductor device in which a metal gate transistor and a passive device are integrated is provided, and the fabrication method of the semiconductor device comprises steps as follows: A hard mask layer is firstly formed to cover a dummy gate electrode and a passive device. A first etching process is subsequently performed to remove a portion of the hard mask layer, so as to expose a portion of a poly-silicon element layer of the passive device. Subsequently, a second etching process is performed to remove the dummy gate electrode. After a metal deposition and a metal planarization process are carried out, a metal gate coplanar with the passive device is provided.

By performing these two separate etching processes respectively thinning the poly-silicon element layer and removing the poly-silicon gate electrode, the passive device and the metal gate can get a coplanar surface on which metal contacts can be formed without remaining undesired metal residues. Therefore the performance of the semiconductor device can be improved significantly.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a semiconductor device comprising:
   providing a dummy gate with a poly-silicon gate electrode and a passive device having a poly-silicon element layer, wherein a top surface of the poly-silicon gate electrode and a top surface of the poly-silicon element layer are coplanar;
   forming a first spacer on sidewalls of two opposite sides of the dummy gate;
   forming a second spacer on sidewalls of two opposite sides of the passive device;
   after forming the first spacer and the second spacer, forming a hard mask layer conformally on the first spacer, the second spacer, the dummy gate and the passive device;
   performing a first etching process to remove a portion of the hard mask layer and a portion of the poly-silicon element layer to form a recess in the passive device exposing a remaining portion of the poly-silicon element layer;
   forming an inner layer dielectric (ILD) on the dummy gate and the poly-silicon element layer;
   flattening the ILD by using the hard mask layer as a polish stop layer;
   performing a second etching process to remove the poly-silicon gate electrode; and
   forming a metal gate electrode on the location where the poly-silicon gate electrode was initially disposed.

2. The method for fabricating the semiconductor device according to claim 1, wherein the formation of the dummy gate and the passive device comprises:
   providing a dielectric material layer and a poly-silicon layer stacked in sequence on a substrate; and
   patterning the dielectric material layer and the poly-silicon layer to form the poly-silicon gate electrode and the poly-silicon element layer on the patterned dielectric material layer.

3. The method for fabricating the semiconductor device according to claim 2, wherein the dielectric material layer comprises an interfacial layer (IL) and a high-k dielectric layer stacked in sequence on the substrate.

4. The method for fabricating the semiconductor device according to claim 3, further comprising steps of forming a capping layer disposed between the metal gate electrode and high-k dielectric layer.

5. The method for fabricating the semiconductor device according to claim 4, further comprising steps of forming a working function layer on the capping layer, prior to the formation of the metal gate electrode.

6. The method for fabricating the semiconductor device according to claim 2, further comprising steps of forming a source/drain structure by using the dummy gate as a mask, before the second etching process is carried out.

7. The method for fabricating the semiconductor device according to claim 2, prior to the formation of the metal gate electrode, further comprising:
   forming a high-k dielectric layer on the location where the poly-silicon gate electrode was initially disposed; and
   forming at least one working function layer on the high-k dielectric layer.

8. The method for fabricating the semiconductor device according to claim 1, wherein the second etching process comprises a wet etching and a dry etching.

9. The method for fabricating the semiconductor device according to claim 1, wherein the steps of flattening the ILD comprise a chemical mechanism polishing (CMP) process.

* * * * *